(12) United States Patent
Zhu (10) Patent No.: US 8,354,753 B2
(45) Date of Patent: Jan. 15, 2013

(54) 3D INTEGRATED CIRCUIT STRUCTURE AND METHOD FOR DETECTING CHIP MIS-ALIGNEMENT

(75) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 36 days.

(21) Appl. No.: 13/203,030

(22) PCT Filed: Feb. 23, 2011

(86) PCT No.: PCT/CN2011/000281
§ 371 (c)(1),
(2), (4) Date: Aug. 24, 2011

(87) PCT Pub. No.: WO2012/003705
PCT Pub. Date: Jan. 12, 2012

(65) Prior Publication Data
US 2012/0056177 A1 Mar. 8, 2012

(30) Foreign Application Priority Data
Sep. 7, 2010 (CN) .......................... 2010 1 0229286

(51) Int. Cl.
*H01L 21/00* (2006.01)
(52) U.S. Cl. ............... 257/777; 257/48; 438/17; 438/14
(58) Field of Classification Search ................... 257/777, 257/48; 438/17, 14
See application file for complete search history.

(56) References Cited

U.S. PATENT DOCUMENTS

| | | | |
|---|---|---|---|
| 6,025,638 A * | 2/2000 | Pogge et al. .................. 257/618 |
| 6,066,513 A * | 5/2000 | Pogge et al. .................. 438/113 |
| 7,012,291 B2 * | 3/2006 | Behfar et al. ................. 257/290 |
| 7,193,423 B1 * | 3/2007 | Dalton et al. ................. 324/662 |
| 7,371,663 B2 * | 5/2008 | Chen et al. .................... 438/460 |
| 7,474,104 B2 * | 1/2009 | Dalton et al. ................. 324/662 |
| 7,619,312 B2 * | 11/2009 | Krishnamoorthy et al. .. 257/777 |
| 7,902,837 B2 * | 3/2011 | Rousseau et al. ............. 324/654 |

(Continued)

FOREIGN PATENT DOCUMENTS
WO PCT/CN2011/000281   2/2011

*Primary Examiner* — Laura Menz
(74) *Attorney, Agent, or Firm* — Troutman Sanders LLP (57) ABSTRACT

The present application discloses a 3D integrated circuit structure and a method for detecting whether there is misalignment between chip structures. The circuit structure comprises a first chip structure which comprises a first semiconductor substrate, a first insulating layer, and a first detection structure; the first detection structure comprises detection bodies positioned on two sides of the first insulating layer, the detection body comprising a first conductor, at least two second conductors, and at least one third conductors; wherein the first conductor is located on a side of the first insulating layer and connected with ends of the second conductors; the third conductors are formed between the second conductors and insulated from the second conductors, and the first ends of the third conductors away from the first conductor are step-wise; wherein vertical distances between the third conductors and the second conductors are equal, and in the direction of the length of the third conductors, the distances between the projections of the ends of the third conductors away from the first conductor which are corresponding to each other and located on the detection bodies on the two sides are substantially the same. The present invention is suitable for optimizing the alignment between the chip structures in manufacture of integrated circuits.

16 Claims, 6 Drawing Sheets

U.S. PATENT DOCUMENTS

| | | | |
|---|---|---|---|
| 7,924,458 B2* | 4/2011 | Taniuchi et al. | 358/1.8 |
| 8,004,289 B2* | 8/2011 | Dalton et al. | 324/662 |
| 8,193,023 B2* | 6/2012 | Ahn | 438/48 |
| 8,232,659 B2* | 7/2012 | Chen et al. | 257/797 |
| 2007/0020871 A1* | 1/2007 | Chen et al. | 438/401 |
| 2007/0132067 A1* | 6/2007 | Dalton et al. | 257/620 |
| 2007/0146734 A1* | 6/2007 | Taniuchi et al. | 358/1.1 |
| 2008/0018000 A1* | 1/2008 | Krishnamoorthy et al. | 257/797 |
| 2008/0157407 A1* | 7/2008 | Chen et al. | 257/797 |
| 2008/0272875 A1* | 11/2008 | Huang et al. | 336/182 |
| 2008/0308948 A1* | 12/2008 | Dalton et al. | 257/777 |
| 2009/0215207 A1* | 8/2009 | Rousseau et al. | 438/17 |
| 2010/0258890 A1* | 10/2010 | Ahn | 257/432 |
| 2010/0308471 A1* | 12/2010 | Korogi et al. | 257/774 |
| 2011/0286190 A1* | 11/2011 | Kursun et al. | 361/783 |
| 2012/0056177 A1* | 3/2012 | Zhu | 257/48 |
| 2012/0175789 A1* | 7/2012 | Farooq et al. | 257/797 |
| 2012/0268909 A1* | 10/2012 | Emma et al. | 361/783 |

* cited by examiner

3D INTEGRATED CIRCUIT STRUCTURE AND METHOD FOR DETECTING CHIP MIS-ALIGNEMENT

CROSS-REFERENCE OF RELATED APPLICATIONS

This application is a Section 371 National Stage Application of, and claims priority to, International Application No. PCT/CN2011/000281, filed Feb. 23, 2011, which claimed priority to Chinese Application No. 201010229286.2, filed Jul. 9, 2010. Both the International application and the Chinese application are incorporated herein by reference in their entireties.

FIELD OF THE INVENTION

The invention relates to the field of semiconductor, and more specially, to a 3D integrated circuit structure and a method for detecting misalignment between chip structures.

BACKGROUND OF THE INVENTION

With the sizes of semiconductor devices shrinking, it is a trend in the development of integrated circuits to integrate more electronic devices on a smaller chip. A 3D integrated circuit requires chip-to-chip, chip-to-wafer, or wafer-to-wafer bonding. However, misalignment due to the bonding of chips or wafers may cause shorts or interconnection opens, which significantly reduces the reliability of the integrated circuits and also increases the cost for manufacturing the integrated circuits to a large extent.

In view of this, it is desired to provide a novel 3D integrated circuit structure and a method for detecting whether there is misalignment between chip structures to increase the reliability of interconnection.

SUMMARY OF THE INVENTION

It is an object of the invention to provide a 3D integrated circuit structure and a method for detecting whether there is misalignment between semiconductor substrates to overcome the above mentioned problems in the prior art.

According to an aspect of the invention, there is provided a 3D integrated circuit structure, comprising: a first chip structure, which comprises a first semiconductor substrate, a first insulating layer, and a first detection structure, wherein: the first insulating layer is located on the first semiconductor substrate, and the first detection structure is embedded into the first insulating layer; the first detection structure comprises detection bodies positioned on two sides of the first insulating layer, the detection body comprising a first conductor, at least two second conductors, and at least one third conductor; the first conductor is located on a side of the first insulating layer and connected with ends of the second conductors, the third conductors are formed between the second conductors and insulated from the second conductors, and the first ends of the third conductors away from the first conductor are step-wise; and the lengths of individual portions of the third conductors facing the second conductors are equal, and in the direction of the length of the third conductors, the distances between the projections of the first ends which are corresponding to each other and located on the detection bodies on the two sides are substantially the same.

Preferably, the second and the third conductors are distributed in parallel; and the third conductors which are located on the respective detection bodies on the two sides and corresponding to each other are aligned in a line.

Preferably, second ends of the third conductors which are close to the first conductor are aligned.

Preferably, the second conductors are equal in length and aligned at both ends.

Preferably, the first conductor is connected with a first conductive pin.

Preferably, the shapes of the first, the second and the third conductors exposed on the surface of the first insulating layer are strip-like, and both the second and the third conductors are perpendicular to the first conductor.

Preferably, the first, the second and the third conductors are formed by a combination comprising any one or more of Cu, Al, W, Ti, Ni, and TiAl.

Preferably, the above mentioned 3D integrated circuit structure further comprises: a second chip structure which comprises a second semiconductor substrate, a second insulating layer and a second detection structure, wherein the second insulating layer is located on the second semiconductor substrate, and the second detection structure is formed embedded into the second insulating layer; the second detection structure comprises a fourth conductor which is located in the middle of the second insulating layer, wherein the first and the second detection structures are bonded to be facing to each other, and the fourth conductor can be electrically connected with at least one of the third conductors so as to form a capacitor with the second conductors.

Preferably, the fourth conductor is connected with a second conductive pin.

Preferably, the width of the fourth conductor in the direction of the length of the third conductor is slightly greater than the distance between the projections of the first ends which are corresponding to each other and located on the detection bodies on two sides.

Preferably, the fourth conductor is formed by a combination comprising any one or more of Cu, Al, W, Ti, Ni, and TiAl.

According to another aspect of the invention, there is provided a method for detecting whether chip structures are aligned, comprising: forming a first chip structure, forming a second chip structure, and performing a detection. In particular, the procedure is as follows.

The first chip structure is formed, which comprises providing a first semiconductor substrate, forming a first insulating layer on the first semiconductor substrate, and forming a first detection structure embedded into the first insulating layer; wherein the first detection structure comprises detection bodies positioned on two sides of the first insulating layer, the detection body comprises a first conductor, at least two second conductors and at least one third conductors; wherein the first conductor is located on a side of the first insulating layer and connected with ends of the second conductors; the third conductors are formed between the second conductors and insulated from the second conductors, and the ends of the third conductors away from the first conductor are step-wise; wherein the vertical distances between the third conductors and the second conductors are equal, and in the direction of the length of the third conductors, the distances between the projections of the ends of the third conductors away from the first conductor which are corresponding to each other and located on the detection bodies on the two sides are substantially the same.

The second chip structure is formed, which comprises providing a second semiconductor substrate, forming a second insulating layer on the second semiconductor substrate, and forming a second detection structure embedded into the second insulating layer; wherein the second detection structure comprises a fourth conductor, and the fourth conductor is located in the middle of the second insulating layer; the first detection structure and the second detection structure are bonded facing to each other, and the fourth conductor can be electrically connected with at least one of the third conductors and therefore form a capacitor with the second conductors. A judgement is made as follows: if the capacitances formed respectively between the fourth conductor and the second conductors on the two sides are equal, it is determined that there is not misalignment between the first and the second chip structures; if the capacitances formed respectively between the fourth conductor and the second conductors on the two sides are unequal, it is determined that there is misalignment between the first and the second chip structures.

Preferably, the second and the third conductors are distributed in parallel; and the third conductors which are located on the respective detection bodies on the two sides and corresponding to each other are aligned in a line.

Preferably, the ends of the third conductors close to the first conductor are aligned.

Preferably, the second conductors are equal in length and aligned at both ends.

The width of the fourth conductor in the direction of the length of the third conductor is slightly greater than the distance between the projections of the first ends which are corresponding to each other and located on the detection bodies on the two sides.

Preferably, the first conductor is connected with a first conductive pin; the fourth conductor is connected with a second conductive pin; then the above mentioned judgement may particularly comprise measuring the capacitances formed respectively by the second conductive pin and the first conductive pins on the two sides; if the capacitances formed respectively by the second conductive pin and the first conductive pins on the two sides are equal, it is determined that there is not misalignment between the first and the second chip structures, and if the capacitances formed respectively by the second conductive pin and the first conductive pins on the two sides are unequal, it is determined that there is misalignment between the first and the second chip structures.

The invention provides a 3D integrated circuit structure and a method for detecting whether there is misalignment between chip structures. A first detection structure comprising first conductors, second conductors, and third conductors is formed on one of the chip structures, and a second detection structure comprising a fourth conductor is formed on the other one of the chip structures. When the two chip structures are bonded using the two detection structures, the fourth conductor can be connected with at least one of the third conductors, and therefore form a capacitor with the protruding structure of the first conductors. It can be determined whether there is misalignment or not between the two chip structures on the basis of capacitances formed by the third conductors and the first conductors on two sides. In a preferred solution of the invention, it can be obtained accurately how much the misalignment is.

BRIEF DESCRIPTION OF THE DRAWINGS

The above and other objects, features and advantages of the invention will be more apparent from the following description of embodiments of the invention with reference to the accompanying drawings, in which:

FIGS. 1-13 show cross-sectional views of individual steps in the flow of manufacturing a 3D integrated circuit according to an embodiment of the invention;

DETAILED DESCRIPTION OF THE INVENTION

In the following, the invention is described by particular embodiments shown in the drawings. However, it should be understood that such a description is exemplary and not intended to limit the scope of the invention. Furthermore, in the following explanation, the description of well-known structures and techniques is omitted to avoid unnecessarily obscuring the concept of the invention.

Schematic views of laminar structures according to embodiments of the invention are shown in the drawings. These drawings are not drawn to scale, wherein some details are amplified and some details may be omitted for clarity. The shapes of various regions, layers and the relative size and position relationship therebetween are merely exemplary, there may be a certain deviation due to the manufacture tolerance or technical limitation in practice, and in practice, those skilled in the art may further design a region/layer having a different shape, size and relative position as desired.

FIGS. 1-13 show in detail cross-sectional views of 3D integrated circuits corresponding to each step in a method for detecting whether semiconductor substrates are aligned according to an embodiment of the invention. In the following, each step according to an embodiment of the invention and the resultant 3D integrated circuit will be described in detail with reference to these figures.

Figure 1:
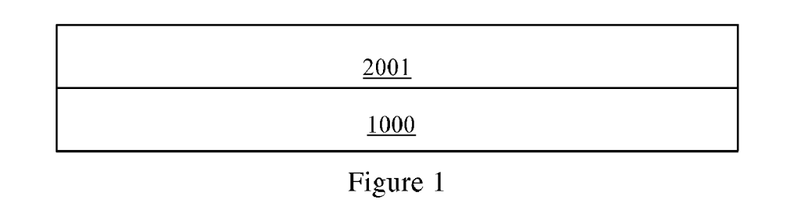

Firstly, a first chip structure is formed. As shown in FIG. 1, a first semiconductor substrate 1000 is provided. Processes such as fabrication of semiconductor devices, BEOL interconnection, etc. may already has been finished on the semiconductor substrate. However, it should be noted that these steps are unrelated to the essence of the invention, and are given as examples which will not be described in detail.

As shown in FIG. 1, a first insulating layer 2001 is formed on the first semiconductor substrate 1000, and a first detection structure is formed on the first insulating layer 2001. In particular, the formed first insulating layer 2001 may be, for example, $SiO_2$ or other dielectric materials.

Figure 2:
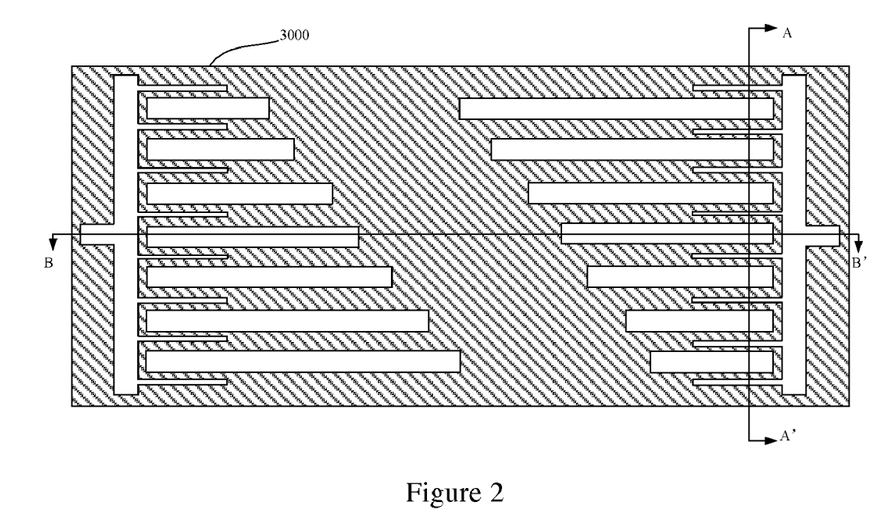
Figure 3:
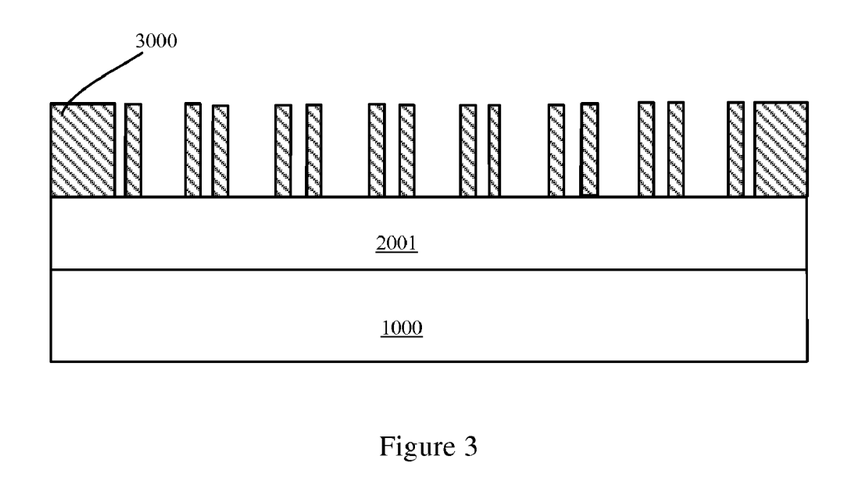

As shown in FIG. 2, a photoresist 3000 is applied on the first insulating layer 2001 and is patterned to form the pattern shown in FIGS. 2 and 3. Herein, FIG. 3 is a cross-sectional view along the A-A' direction in FIG. 2.

Figure 4:
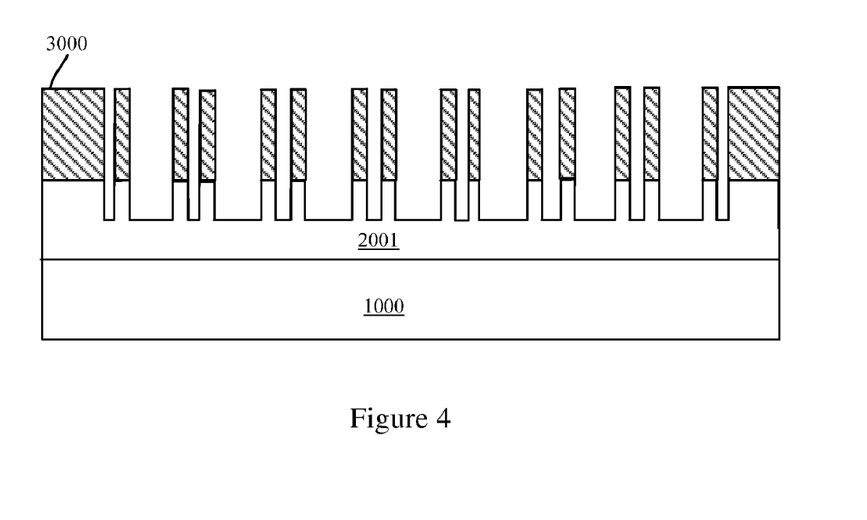

The first insulating layer 2001 is etched to form grooves with the photoresist pattern shown in FIGS. 2 and 3 as a mask, as shown in FIG. 4.

The photoresist 3000 is removed.

Figure 5:
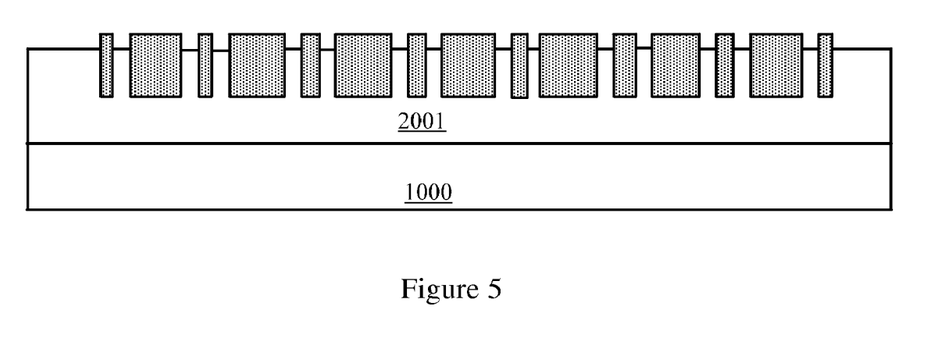
Figure 6:
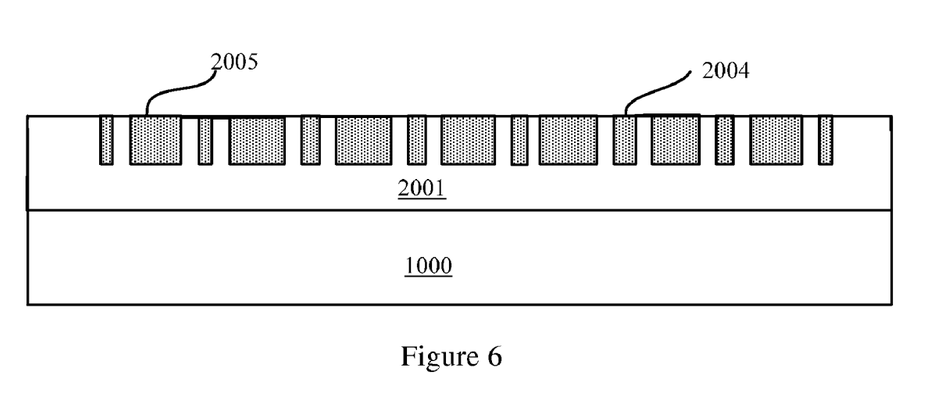

Next, as shown in FIG. 5, the grooves are filled with a conductive material, which may be, for example, a combination of any one or more of Cu, Al, W, Ti, Ni, and TiAl, or an alloy thereof. In an embodiment of the invention, Cu is selected as the filling material. As shown in FIG. 6, a CMP (Chemical Mechanical Polishing) process is performed to planarize the surface of the first insulating layer 2001, thereby forming a structure in which the conductive material are embedded in the grooves of the first insulating layer 2001.

Figure 7:
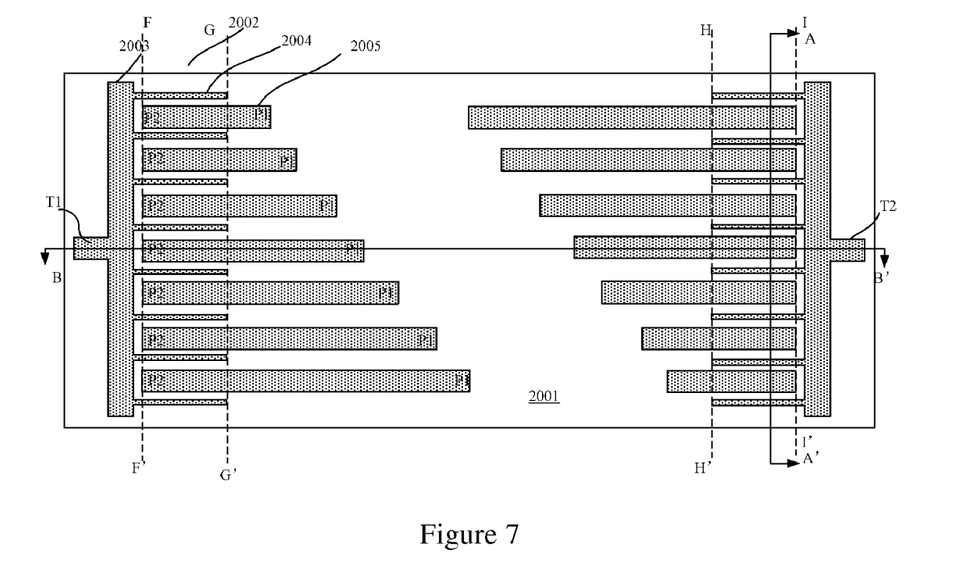

As shown in FIG. 7, Cu is embedded into the grooves to form a first detection structure. The first detection structure comprises detection bodies 2002 located on the left and right sides, which comprise a first conductor 2003, a second conductor 2004, and third conductors 2005, respectively.

Next, a first pin may be formed on the first conductor 2003, for which one may refer to T1, T2 in FIG. 7. This step is a conventional technique and will not be described in detail.

So far, a 3D integrated circuit structure obtained according to an embodiment of the invention is accomplished. As shown in FIGS. 6 and 7, the 3D integrated circuit structure comprises a first chip structure, which particularly comprises a first semiconductor substrate 1000, a first insulating layer 2001 on the first semiconductor substrate, and a first detection structure embedded into the first insulating layer 2001; the first detection structure comprises detection bodies 2002 located on two sides of the first insulating layer, the detection body 2002 comprises a first conductor 2003, at least two second conductors 2004, and at least one third conductor 2005, wherein the first conductor 2003 is located on a side of the first insulating layer 2001 and connected with ends of the second conductors 2004; the third conductors 2005 are formed between the second conductors 2004 and insulated from the second conductors 2004, the first ends P1 of the third conductors 2005 away from the first conductor 2003 are step-wise; wherein the lengths of individual portions of the third conductors 2005 facing the second conductors 2004 are equal, and in the direction of the length of the third conductors, the distances between the projections of the first ends P1 which are corresponding to each other and located on the detection bodies 2002 on the two sides are substantially the same. It should be noted that the direction of the length of the third conductor is the lateral direction as shown in FIG. 7 since the third conductors are strip-like.

Preferably, as shown in FIG. 7, the distances between the dashed lines FF' and GG' and between HH' and II' are the facing distances between the second and third conductors; and the distances are equal, such that the capacitances of the individual parallel-plate capacitors formed between the conductors facing to each other are equal.

Preferably, the second conductors 2004 and the third conductors 2005 are distributed in parallel; and the third conductors 2005 which are corresponding to each other and located on the detection bodies 2002 on the two sides are aligned in a line.

Preferably, the second ends P2 of the third conductors 2005 close to the first conductor 2003 are aligned.

Preferably, the lengths of the second conductors 2004 are equal and both ends thereof are aligned.

For a preferred embodiment of the invention, as shown in FIG. 7, the detection bodies 2002 on the left and right sides are symmetric with respect to the center of the surface of the first insulating layer 2001. Such a symmetric structure is very conducive to implementation of the invention, i.e., enables the measurement of the capacitance formed between the second and third conductors to be more accurate.

Preferably, as shown in FIG. 7, the first conductors 2003 are also connected with the first conductive pins T1 and T2.

Preferably, the first conductor 2003, the second conductors 2004, and the third conductors 2005 may be formed of a material combination comprising any one or more of Cu, Al, W, Ti, Ni, and TiAl.

In a method for detecting whether there is misalignment between semiconductor substrates according to an embodiment of the invention, it is required to further form a second chip structure.

Figure 8:
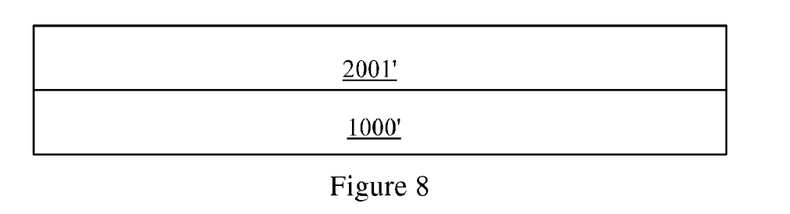

As shown in FIG. 8, a second semiconductor substrate 1000' is provided, and a second insulating layer 2001' is formed on a second semiconductor substrate 1000'. A second detection structure is formed embedded into the second insulating layer 2001'.

As shown in FIG. 9, the second detection structure comprises a fourth conductor 2002', and the fourth conductor 2002' is formed by being embedded in the center of the second insulating layer 2001'. The material of the fourth conductor 2002' may comprise a combination of any one or more of Cu, Al, W, Ti, Ni, and TiAl. The width of the fourth conductor 2002' in the direction of the length of the third conductor 2005 is slightly larger than the distance between the projections of the first ends P1 which are corresponding to each other and located on the respective detection bodies 2002 on the two sides, so as to be electrically connected with the third conductor. There is no limitation to the pattern of the fourth conductor 2002', and its surface is preferably a rectangular structure. However, it should at least be ensured that the fourth conductor can be electrically connected with one of the third conductors on the first detection structure when the first detection structure and the second detection structure are bonded for alignment.

As for the method for manufacturing the second detection structure on the second semiconductor substrate, reference may be made to the method for manufacturing the first semiconductor structure. In particular, the method may comprise: depositing the second insulating layer 2001' on the second semiconductor substrate 1000'; then patterning a photoresist on the second insulating layer 2001' to form the pattern of the fourth conductor 2002'; etching downwards the insulating layer 2001' with the patterned photoresist as a mask to form grooves; then filling the grooves with a conductive material, which, for example, comprises a combination of any one or more of Cu, Al, W, Ti, Ni, and TiAl; performing a CMP process; and finally forming a pin T3 on the fourth conductor.

Figure 10:
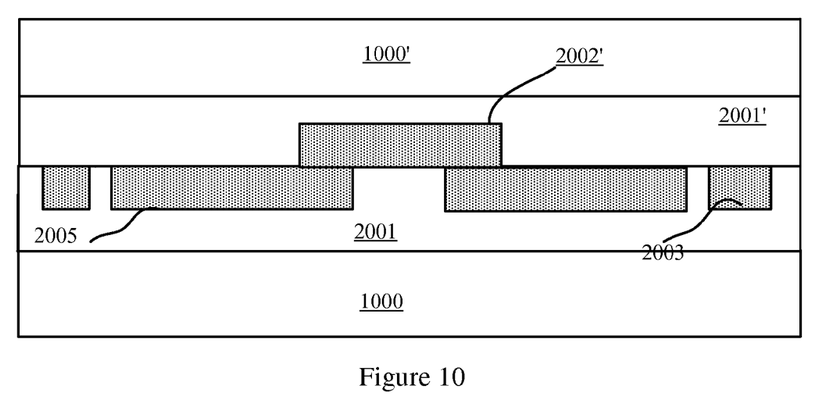

Bonding the first chip structure shown in FIG. 7 with the second chip structure shown in FIG. 9 by the first and second detection structures, a 3D integrated circuit structure according to an embodiment of the invention is thus accomplished. As shown in FIG. 10, the 3D integrated circuit structure comprises two semiconductor chip structures as described above. The first chip structure at the bottom of FIG. 10 is a cross-sectional view along the B-B' direction in FIG. 7, and the second chip structure at the top of FIG. 10 is a cross-sectional view along the C-C' direction in FIG. 9. Herein, if the two chip structures are aligned with each other, the fourth conductor 2002' can be connected with the third conductors 2005 on the left and right sides on the first detection structure.

In an embodiment of the invention, preferably the second conductors 2004 are distributed in parallel with the third conductors 2005, and the lengths of individual portions of the second conductors 2004 facing the third conductors 2005 are equal. Preferably, the second ends of the third conductors 2005 on substantially the same side close to the first conductor 2003 are aligned, and the first ends P1 away from the first conductor 2003 are step-wise. Preferably, the differences in length between the first ends P1 of adjacent third conductors away from the first conductor 2003 are equal. Preferably, the lengths of the second conductors 2004 on the detection body are equal and both ends thereof are aligned. For a preferred embodiment of the invention, the two detection bodies 2002 on the first chip structure can be symmetric about a center, and then the capacitances between each pair of the third conductors and the second conductors which face to each other are substantially completely the same. Such a structure ensures that, if the fourth conductor is located at the middle position of the first semiconductor structure, namely, the first chip structure is exactly aligned with the second chip structure, the numbers of the third conductors on the two sides which are electrically connected with the fourth conductor are equal.

Figure 11:
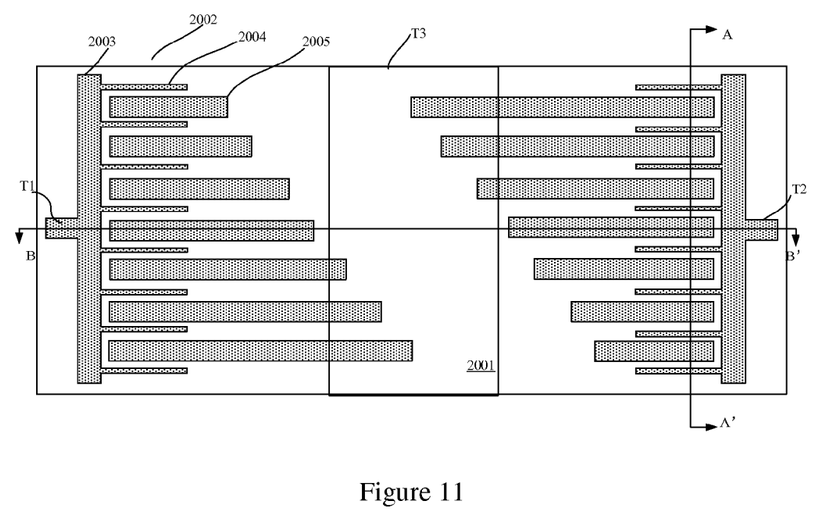

As shown in FIG. 11, the pin on the first conductor on the left side of the first chip structure is T1, the pin on the first conductor on the right side is T2, and a pin T3 is disposed on the fourth conductor on the second chip structure. FIGS. 10 and 11 are schematic views in which the first and second chip structures are exactly aligned with each other, and the fourth conductor is connected with three of the third conductors on the left side and also connected with three of the third conductors on the right side, which therefore results in the fact that the capacitance between T3 and T2 is equal to the capacitance between T3 and T1.

Figure 12:
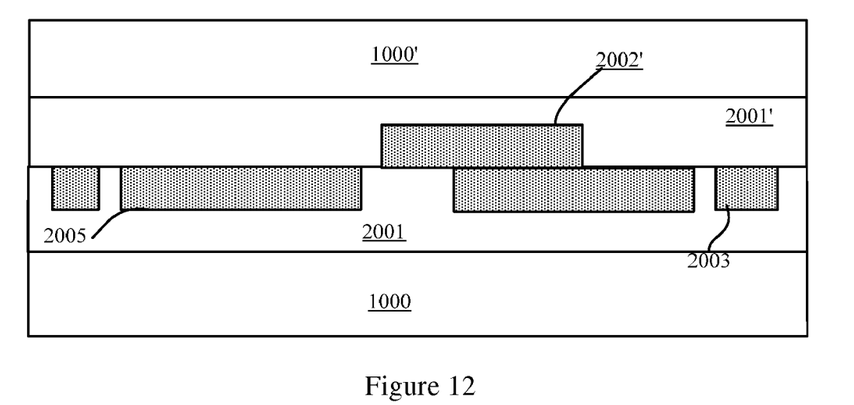
Figure 13:
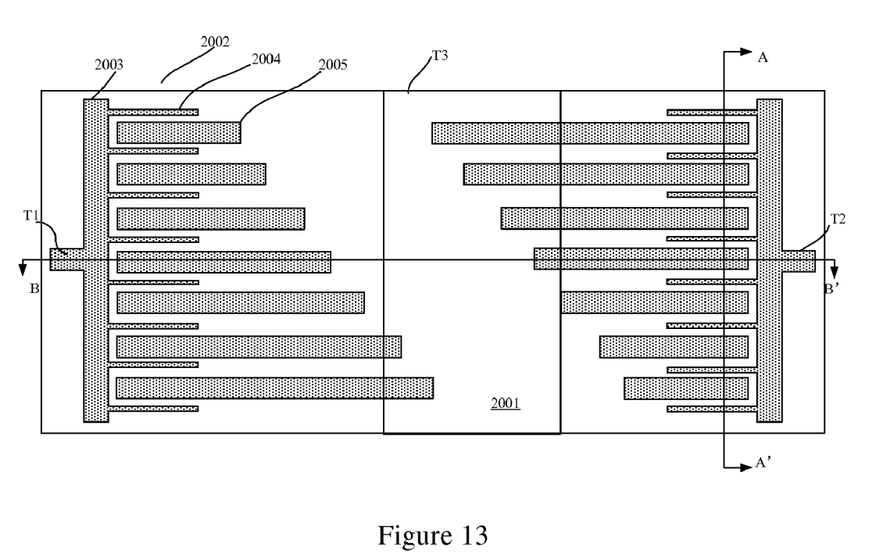

It can be seen that, if there is a misalignment between the first and second chip structures, as shown in FIGS. 12 and 13, the fourth conductor is connected with two of the third conductors on the left side and four of the third conductors on the right side. In this case, the capacitance between T3 and T2 will not be equal to the capacitance between T3 and T1, i.e., the capacitance between T3 and T2 will be greater than that between T3 and T1, from which it can be inferred that the second chip structure needs to be moved to the left for correct alignment. Therefore, from the measured difference between capacitances, it can be known how much misalignment there is between the two chip structures and how a movement should be made to ensure alignment.

In embodiments of the invention, the misalignment between the chip structures can be measured accurately, and therefore the chip structures can be moved to achieve alignment. The method according to embodiments of the invention can detect simply and efficiently the misalignment between the chip structures, and can be widely used in the manufacture of a 3D integrated circuit.

Figure 14:
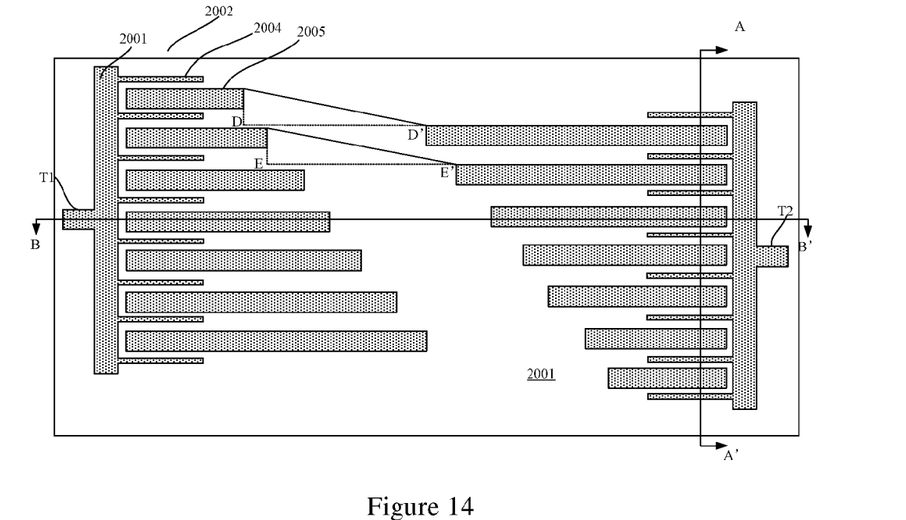
FIGS. 14-15 show cross-sectional views of a first chip structure in a resulting 3D integrated circuit according to further embodiments of the invention.

Various variations are possible for the embodiments of the invention. As shown in FIG. 14, the first and second conductors on the left and right sides are displaced and correspond one to one. Therefore, in the line where the length of the third conductor lies, the invention may also be realized as long as the distances between the projections of the ends of the corresponding third conductors away from the first conductor are equal, i.e. the lengths of DD' and EE' shown in FIG. 14 are equal.

Figure 15:
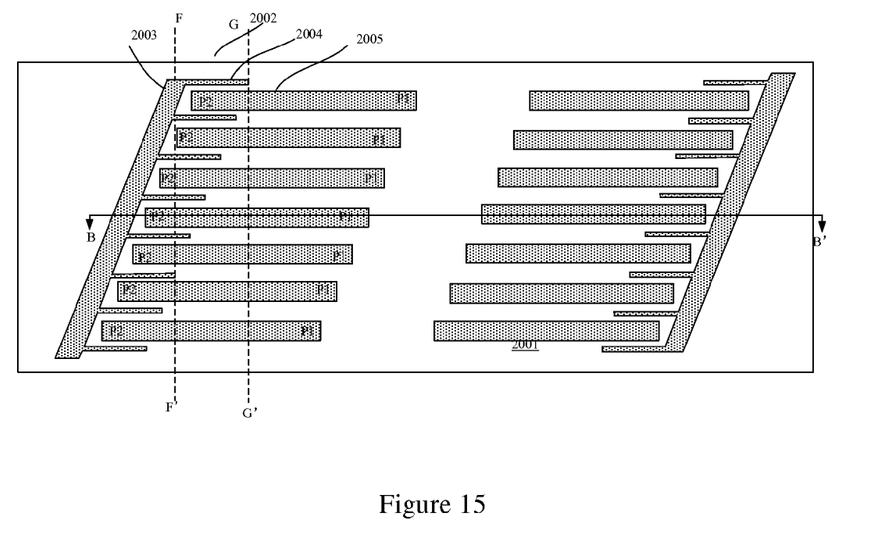

Furthermore, as shown in FIG. 15, both ends of the second and the third conductors may also not be strictly aligned. As long as the lengths of individual portions of the second conductors facing the third conductors are equal, the invention can be implemented.

In the above description, such technical details as the patterning, etching, etc. of the layers have not been illustrated in detail. However, it will be understood by those skilled in the art that a layer, region, etc. with a desired shape may be formed by various means in the prior art. Furthermore, a method not exactly identical to the method described above may also be designed by those skilled in the art to form an identical structure.

A method for forming a detection structure on a semiconductor substrate is used according to embodiments of the invention, and it is determined whether there is misalignment between the chip structures on the basis of the capacitances formed between the detection structures after the bonding of the detection structures. Such a method is simple and efficient, and has a good detection effect. Furthermore, the manufacture processes needed for embodiments of the invention are simple, and they may be accomplished by conventional semiconductor manufacture processes.

While the invention has been described with reference to the embodiments of the invention, these embodiments are only for the purpose of illustration, and not for limitation to the scope of the invention. The scope of the invention is defined by the appended claims and the equivalent thereof. Many alternatives and modifications may be made by those skilled in the art without departing from the scope of the invention, which alternatives and modifications fall within the scope of the invention.

What is claimed is:

1. A 3D integrated circuit structure, comprising: a first chip structure, which comprises a first semiconductor substrate, a first insulating layer, and a first detection structure, wherein:
   the first insulating layer is located on the first semiconductor substrate, and the first detection structure is embedded into the first insulating layer;
   the first detection structure comprises detection bodies positioned on two sides of the first insulating layer, the detection body comprising a first conductor, at least two second conductors, and at least one third conductor;
   the first conductor is located on a side of the first insulating layer and connected with ends of the second conductors, the third conductors are formed between the second conductors and insulated from the second conductors, and the first ends of the third conductors away from the first conductor are step-wise; and
   the lengths of individual portions of the third conductors facing the second conductors are equal, and in the direction of the length of the third conductors, the distances between the projections of the first ends which are corresponding to each other and located on the detection bodies on the two sides are substantially the same.

2. The 3D integrated circuit structure according to claim 1, wherein the second and the third conductors are distributed in parallel; and the third conductors which are located on the respective detection bodies on the two sides and corresponding to each other are aligned in a line.

3. The 3D integrated circuit structure according to claim 1, wherein second ends of the third conductors which are close to the first conductor are aligned.

4. The 3D integrated circuit structure according to claim 1, wherein the second conductors are equal in length and aligned at both ends.

5. The 3D integrated circuit structure according to claim 1, wherein the first conductor is connected with a first conductive pin.

6. The 3D integrated circuit structure according to claim 1, wherein the shapes of the first, the second, and the third conductors exposed on the surface of the first insulating layer are strip-like, and both the second and the third conductors are perpendicular to the first conductor.

7. The 3D integrated circuit structure according to claim 1, wherein the first, the second, and the third conductors are formed by a combination comprising any one or more of Cu, Al, W, Ti, Ni, and TiAl.

8. The 3D integrated circuit structure according to claim 1, further comprising:
   a second chip structure which comprises a second semiconductor substrate, a second insulating layer and a second detection structure, wherein the second insulating layer is located on the second semiconductor substrate, and the second detection structure is formed embedded into the second insulating layer;
   the second detection structure comprises a fourth conductor which is located in the middle of the second insulating layer,
   wherein the first and the second detection structures are bonded to be facing to each other, and the fourth conductor can be electrically connected with at least one of the third conductors so as to form a capacitor with the second conductors.

9. The 3D integrated circuit structure according to claim 8, wherein the fourth conductor is connected with a second conductive pin.

10. The 3D integrated circuit structure according to claim 8, wherein the width of the fourth conductor in the direction of the length of the third conductor is slightly greater than the distance between the projections of the first ends which are corresponding to each other and located on the detection bodies on the two sides.

11. The 3D integrated circuit structure according to claim 8, wherein the fourth conductor is formed by a combination comprising any one or more of Cu, Al, W, Ti, Ni, and TiAl.

12. A method for detecting whether chip structures are aligned, comprising:

forming a first chip structure, which comprises providing a first semiconductor substrate, forming a first insulating layer on the first semiconductor substrate, and forming a first detection structure embedded into the first insulating layer; wherein the first detection structure comprises detection bodies positioned on two sides of the first insulating layer, the detection body comprises a first conductor, at least two second conductors, and at least one third conductors; wherein the first conductor is located on a side of the first insulating layer and connected with ends of the second conductors; the third conductors are formed between the second conductors and insulated from the second conductors, and the ends of the third conductors away from the first conductor are step-wise; wherein the vertical distances between the third conductors and the second conductors are equal, and in the direction of the length of the third conductors, the distances between the projections of the ends of the third conductors away from the first conductor which are corresponding to each other and located on the detection bodies on the two sides are substantially the same;

forming a second chip structure, which comprises providing a second semiconductor substrate, forming a second insulating layer on the second semiconductor substrate, and forming a second detection structure embedded into the second insulating layer; wherein the second detection structure comprises a fourth conductor which is located in the middle of the second insulating layer;

bonding the first detection structures with the second detection structures which are facing to each other, wherein the fourth conductor can be electrically connected with at least one of the third conductors and therefore form a capacitor with the second conductors;

making a judgement as follows: if the capacitances formed respectively between the fourth conductor and the second conductors on the two sides are equal, it is determined that there is not misalignment between the first and the second chip structures; if the capacitances formed respectively between the fourth conductor and the second conductors on the two sides are unequal, it is determined that there is misalignment between the first and the second chip structures.

13. The method according to claim 12, wherein the second and the third conductors are distributed in parallel; and the third conductors which are located on the respective detection bodies on the two sides and corresponding to each other are aligned in a line.

14. The method according to claim 12, wherein the ends of the third conductors close to the first conductor are aligned.

15. The method according to claim 12, wherein the second conductors are equal in length and aligned at both ends.

16. The method according to claim 12, wherein the first conductor is connected with a first conductive pin; the fourth conductor is connected with a second conductive pin;

the judgement comprises measuring the capacitances formed respectively by the second conductive pin and the first conductive pins on the two sides; if the capacitances formed respectively by the second conductive pin and the first conductive pins on the two sides are equal, it is determined that there is not misalignment between the first and the second chip structures, and if the capacitances formed respectively by the second conductive pin and the first conductive pins on the two sides are unequal, it is determined that there is misalignment between the first and the second chip structures.

\* \* \* \* \*